(12) United States Patent
Ji et al.

(10) Patent No.: US 8,854,905 B2
(45) Date of Patent: Oct. 7, 2014

(54) SEMICONDUCTOR DEVICE AND OPERATION METHOD THEREOF

(71) Applicant: SK hynix Inc., Gyeonggi-do (KR)

(72) Inventors: Jung-Hwan Ji, Gyeonggi-do (KR); Geun-Il Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 23 days.

(21) Appl. No.: 13/830,562

(22) Filed: Mar. 14, 2013

(65) Prior Publication Data

US 2014/0063991 A1    Mar. 6, 2014

(30) Foreign Application Priority Data

Aug. 31, 2012  (KR) .................. 10-2012-0096424

(51) Int. Cl.
*G11C 7/00* (2006.01)
*G11C 7/22* (2006.01)
*G11C 7/10* (2006.01)
*G11C 7/04* (2006.01)
*G11C 7/02* (2006.01)

(52) U.S. Cl.
CPC ................ *G11C 7/222* (2013.01); *G11C 7/109* (2013.01); *G11C 7/04* (2013.01); *G11C 7/02* (2013.01)
USPC .................... 365/194; 365/189.16; 365/233.1

(58) Field of Classification Search
USPC ............. 365/194, 189.16, 233.1, 191, 189.17
See application file for complete search history.

(56) References Cited

U.S. PATENT DOCUMENTS 8,619,480 B2 * 12/2013 Li et al. .......................... 365/194

FOREIGN PATENT DOCUMENTS

| KR | 1019980004990 | 3/1998 |
| KR | 1020080046978 | 5/2008 |

* cited by examiner

*Primary Examiner* — David Lam
(74) *Attorney, Agent, or Firm* — IP & T Group LLP

(57) ABSTRACT

A semiconductor device may include an internal circuit configured to perform write operations in response to each of a plurality of write commands, wherein the plurality of write commands are sequentially input to the internal circuit, a first pulse generation unit configured to generate a first pulse activated during a first delay amount in response to a write command, a second pulse generation unit configured to generate a second pulse activated during the first delay amount in response to a delayed write command out of the plurality of write commands after a second delay amount from the activation time of the first pulse, and a transfer control unit configured to prevent commands other than the plurality of write commands from being transferred to the internal circuit during a sum of the activation period of the first pulse and the activation period of the second pulse.

21 Claims, 6 Drawing Sheets

US 8,854,905 B2

SEMICONDUCTOR DEVICE AND OPERATION METHOD THEREOF

CROSS-REFERENCE TO RELATED APPLICATIONS

The present invention claims priority of Korean patent application number 10-2012-0096424, filed on Aug. 31, 2012, which is incorporated by reference in its entirety.

BACKGROUND OF THE INVENTION

Exemplary embodiments of the present invention relate to a semiconductor device and an operation method thereof, more particularly, to a semiconductor device and an operation method thereof for securing a write recovery time.

A write recovery time is defined as from a time point of completion of write operation to a time point of stable storage of data to a cell of a semiconductor device without vulnerability to a pre-charge operation, which means amount of delay that must elapse after the completion of a valid write operation, before an active bank can be precharged. That is, the write recover time represents a minimum time requested to secure stored data on a cell of a semiconductor device after the completion of a valid write operation.

A conventional semiconductor device adjusts an input time of a pre-charge command to secure the write recovery time.

Meanwhile, as a semiconductor device operates at a high speed, internal signals of the semiconductor device may be incorrectly transferred due to a noise according to a Process, Voltage and Temperature (PVT).

For example, although a controller of a semiconductor device transfers sequentially a write command for a first bank and a pre-charge command for a second bank to perform a write operation of the first bank and a pre-charge operation of the second bank, the pre-charge command for the second bank may be corrupted and misidentified with a pre-charge command for the first bank due to a noise caused by the PVT, and the write command and the misidentified pre-charge command for the first bank may be sequentially transferred to the semiconductor device.

In such a case, since the first bank receives the write command and the misidentified pre-charge command sequentially, a write recovery time corresponding to the write command may not be secured.

That is, since the write command is correct command whereas the misidentified pre-charge command right after the write command is an incorrect command where the timing of the write recovery time is not reflected, a data to be stored according to the write operation may be corrupted.

Here, since a conventional semiconductor device does not detect whether or not a pre-charge command is misidentified, it is impossible to secure a write recovery time in a manner of adjusting an applying time of a pre-charge command.

SUMMARY OF THE INVENTION

Embodiments of the present invention are directed to providing a semiconductor device and an operation method thereof for securing a write recovery time.

Moreover, embodiments of the present invention are directed to providing a semiconductor device and an operation method thereof for stably securing a write recovery time despite of misidentification of a precharge command due to a noise.

In accordance with an aspect of the present invention, semiconductor device may include an internal circuit configured perform write operations in response to each of a plurality of write commands, wherein the plurality of write commands are sequentially input to the internal circuit, a first pulse generation unit configured to generate a first pulse activated during a first delay amount in response to a write command, which is input during an inactivation period of the first pulse, out of the plurality of write commands, a second pulse generation unit configured to generate a second pulse activated during the first delay amount in response to a delayed write command, which is input during an inactivation period of the second pulse, out of the plurality of write commands after a second delay amount from the activation time of the first pulse, and a transfer control unit configured to prevent command other than the plurality of write commands from being transferred to the internal circuit during a sum of the activation period of the first pulse and the activation period of the second pulse.

In accordance with another aspect of the present invention, an operation method of a semiconductor device may include activating a first pulse and inactivating a second input preparation signal in response to a plurality of write commands when a first input preparation is activated and the first pulse is inactivated, wherein the plurality of write commands are sequentially input to an internal circuit, activating the second input preparation signal at a delayed time from the activation of the first pulse by a first delay amount, and inactivating the first pulse at a second delay amount, activating a second pulse and inactivating the first input preparation signal in response to the plurality of write commands when the second input preparation signal is activated and the second pulse is inactivated, activating the first input preparation signal at a delayed time from the activation of the second pulse by the first delay amount and inactivating the second pulse at a delayed time by the second delay amount after the first delay amount, and preventing commands other than the plurality of write commands from being transferred to the internal circuit during an overlapped period of the activation of the first pulse and the activation of the second pulse.

DESCRIPTION OF SPECIFIC EMBODIMENTS

Figure 1:
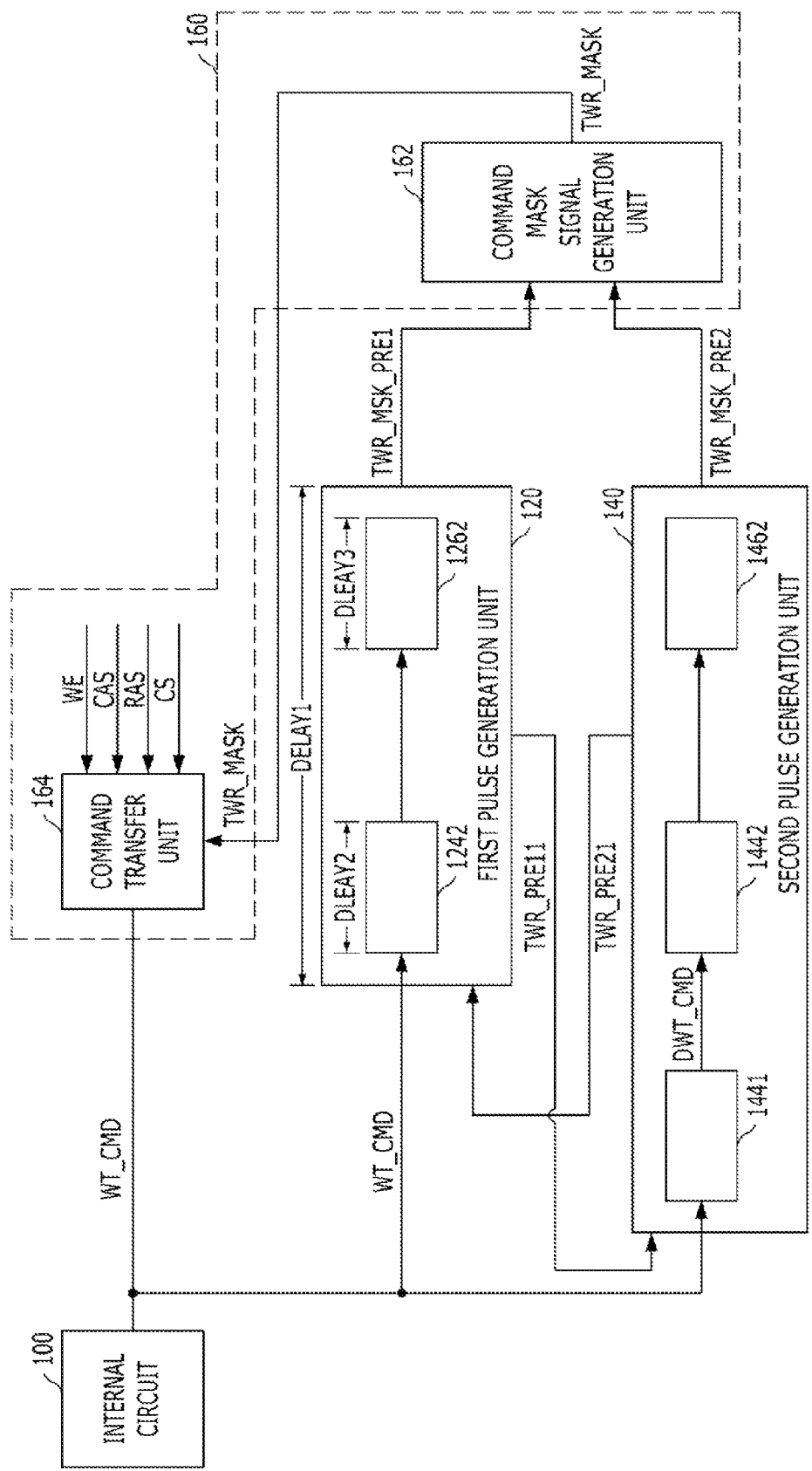
FIG. 1 is a circuit diagram illustrating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. In addition, a singular form may include a plural form as long as it is not specifically mentioned in a sentence.

FIG. 1 is a circuit diagram illustrating a semiconductor device in accordance with an embodiment of the present invention.

Referring to FIG. 1, a semiconductor device in accordance with an embodiment of the present invention includes an internal circuit 100, a first pulse generation unit 120, a second pulse generation unit 140 and a transfer control unit 160.

The internal circuit 100 performs sequential write operations in response to a plurality of write commands WT_CMD that are received sequentially.

The first pulse generation unit 20 generates a first pulse TWR_MSK_PRE1, which is activated during a first delay amount DELAY1 in response to at least one of a plurality of write commands WT_CMD during a deactivation period of the first pulse TWR_MSK_PRE1.

Here, the first delay amount DELAY1 is a delay amount to secure the write recovery time for each of the plurality of write commands WT_CMD. The first delay amount DELAY1 may be designed as a replica model of the time for writing data on a cell, and may be synchronized with an operation clock of the semiconductor device or may be preset. The detailed configuration of the first pulse generation unit 120 will be described in FIG. 2

The second pulse generation unit 140 generates a second pulse TWR_MSK_PRE2, which is activated during the first delay amount DELAY1 in response to a plurality of write commands WT_CMD during a deactivation period of the second pulse TWR_MSK_PRE2 after a second delay amount DELAY2 from an activation time of the first pulse TWR_MSK_PRE1. The detailed configuration of the second pulse generation unit 140 will be described in FIG. 3.

The transfer control unit 160 prevents the other command except the plurality of write commands WT_CMD from being transferred to the internal circuit 100 during a sum of the activation period of the first pulse TWR_MSK_PRE1 and the activation period of the second pulse TWR_MSK_PRE2.

Here, the transfer control unit 160 includes a command mask signal generation unit 162 and a command transfer unit 164.

The command mask signal generation unit 162 generates a command mask signal TWR_MASK having an activation period corresponding to a sum of the activation period of the first pulse TWR_MSK_PRE1 and the activation period of the second pulse TWR_MSK_PRE2. The command transfer unit 164 transfers only the plurality of write commands WT_CMD to the internal circuit 100 during the activation period of the mask signal TWR_MASK. That is, the command transfer unit 164 does not transfer the other command except the plurality of write commands WT_CMD during the activation period of the mask signal TWR_MASK.

The other command may be a precharge command. That is when the misidentified precharge command is input after the plurality of write commands WT_CMD is input, the semiconductor device may not perform a correct write operation. Thus, in order to block the misidentified precharge command and thus secure the write recovery time, any precharge command, which is input during a specific time period, is prevented from being transferred to the internal circuit 100 after the plurality of write commands WT_CMD are input. Here, the precharge command is an exemplary command of the other commands.

Figure 2:
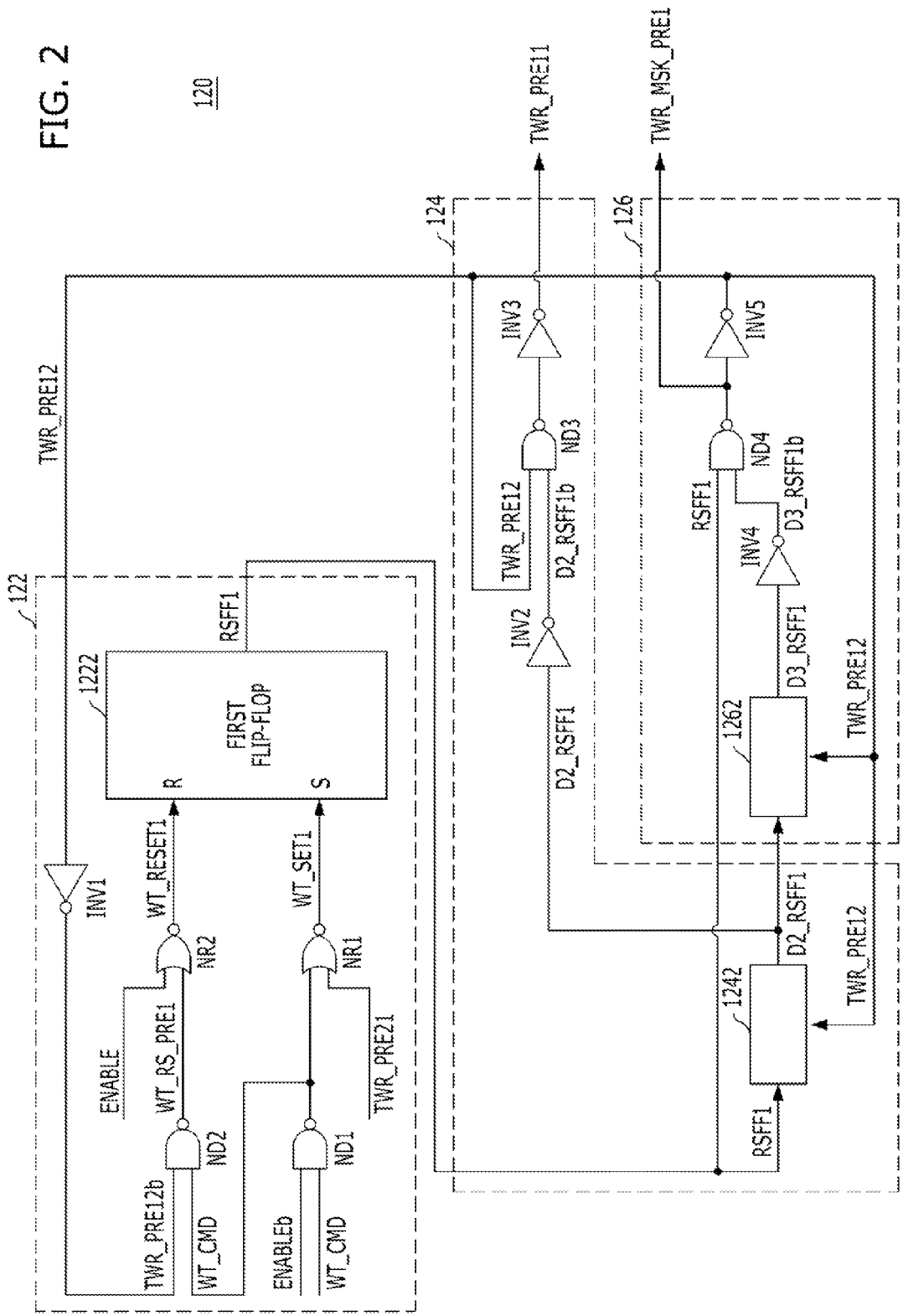
FIG. 2 is a circuit diagram illustrating a first pulse generation unit shown in FIG. 1 in accordance with an embodiment of the present invention.

FIG. 2 is a circuit diagram illustrating a first pulse generation unit shown in FIG. 1 in accordance with an embodiment of the present invention.

As shown in FIG. 2, the first pulse generation unit 120 includes a first pulse activation control unit 122, a first input preparation signal activation control unit 124, and a first operation initial signal activation control unit 126.

The first pulse activation control unit 122 activates a first pulse TWR_MSK_PRE1 in response to a first write command out of the plurality of write commands WT_CMD when the first pulse TWR_MSK_PRE1 is inactivated during an activation period of a first input preparation signal TWR_PRE21 and inactivates the first pulse TWR_MSK_PRE1 in response to an activation of a first operation initial signal TWR_PRE12.

The first pulse activation control unit 122 includes a first inverter INV1, a first NAND gate ND1, a first NOR gate NR1, a second NAND gate ND2, a second NOR gate NR2, and a first flip-flop 1222.

The first inverter INV1 inverts the first operation initial signal TWR_PRE12 and outputs an inverted first operation initial signal TWR_PRE12b. The first NAND gate ND1 receives the plurality of write commands WT_CMD and an inverted enable signal ENABLEb and performs a NAND logic operation. The first NOR gate NR1 receives the first input preparation signal TWR_PRE21 and the plurality of write commands that are NAND logic operated by the first NAND gate ND1, performs a NOR logic operation, and outputs a plurality of first flip-flop set signals WT_SET1. The second NAND gate ND2 receives the plurality of write commands that are NAND logic operated by the first NAND gate ND1 and the inverted first operation initial signal TWR_PRE12b, and outputs a plurality of first reset preparation signals WT_RS_PRE1. The second NOR gate NR2 receives an enable signal ENABLE and the plurality of reset preparation signals WT_RS_PRE1, performs a NOR logic operation, and outputs a plurality of first flip-flop reset signals WT_RESET1. The first flip-flop 1222 activates a first pre-pulse RSFF1 in response to the plurality of first flip-flop set signals WT_SET1 and inactivates the first pre-pulse RSFF1 in response to the plurality of first flip-flop reset signals WT_RESET1.

The first input preparation signal activation control unit 124 activates a second input preparation signal TWR_PRE11 at a delayed time from the activation time of the first pulse TWR_MSK_PRE1 by the second delay amount DELAY2 and inactivates the second input preparation signal TWR_PRE11 in response to inactivation of the first operation initial signal TWR_PRE12.

The first input preparation signal activation control unit 124 includes a first delay unit 1242, a second inverter INV2, a third NAND gate ND3, and a third inverter INV3.

The first delay unit 1242 receives and delays the first pre-pulse RSFF1 by the second delay amount. DELAY2 and outputs a first D2_delay pre-pulse D2_RSFF1. The second inverter INV2 inverts the first D2_delay pre-pulse D2_RSFF1 and outputs an inverted first D2_delay pre-pulse D2_RSFF1b. The third NAND gate ND3 receives the inverted first D2_delay pre-pulse D2_RSFF1b and the first operation initial signal TWR_PRE12 and performs a NAND logic operation. The third inverter INV3 inverts a result value of the NAND logic operation and outputs the second input preparation signal TWR_PRE11.

The first operation initial signal activation control unit 126 activates the first operation initial signal TWR_PRE12 at a delayed time from the activation time of the second input preparation signal TWR_PRE11 by a third delay amount DELAY3 and inactivates the first operation initial signal TWR_PRE12 in response to the activation of the first pulse TWR_MSK_PRE1. The first delay amount DELAY1 is substantially same as a sum of the second delay amount DELAY2 and the third delay amount DELAY3.

The first operation initial signal activation control unit 126 includes a second delay unit 1262, a fourth inverter INV4, a fourth NAND gate ND4, and a fifth inverter INV5.

The second delay unit 1262 receives and delays the first D2_delay pre-pulse D2_RSFF1 by the third delay amount DELAY3 and outputs a first D3_delay pre-pulse D3_RSFF1. The fourth inverter INV4 inverts the first D3_delay pre-pulse D3_RSFF1 and outputs an inverted first D3_delay pre-pulse D3_RSFF1b. The fourth NAND gate ND4 receives the inverted first D3_delay pre-pulse D3_RSFF1b and the first pre-pulse RSFF1, performs a NAND logic operation, and outputs the first pulse TWR_MSK_PRE1. The fifth inverter INV5 inverts the first pulse TWR_MSK_PRE1 and outputs the first operation initial signal TWR_PRE12 as the inverted first pulse TWR_MSK_PRE1.

Figure 3:
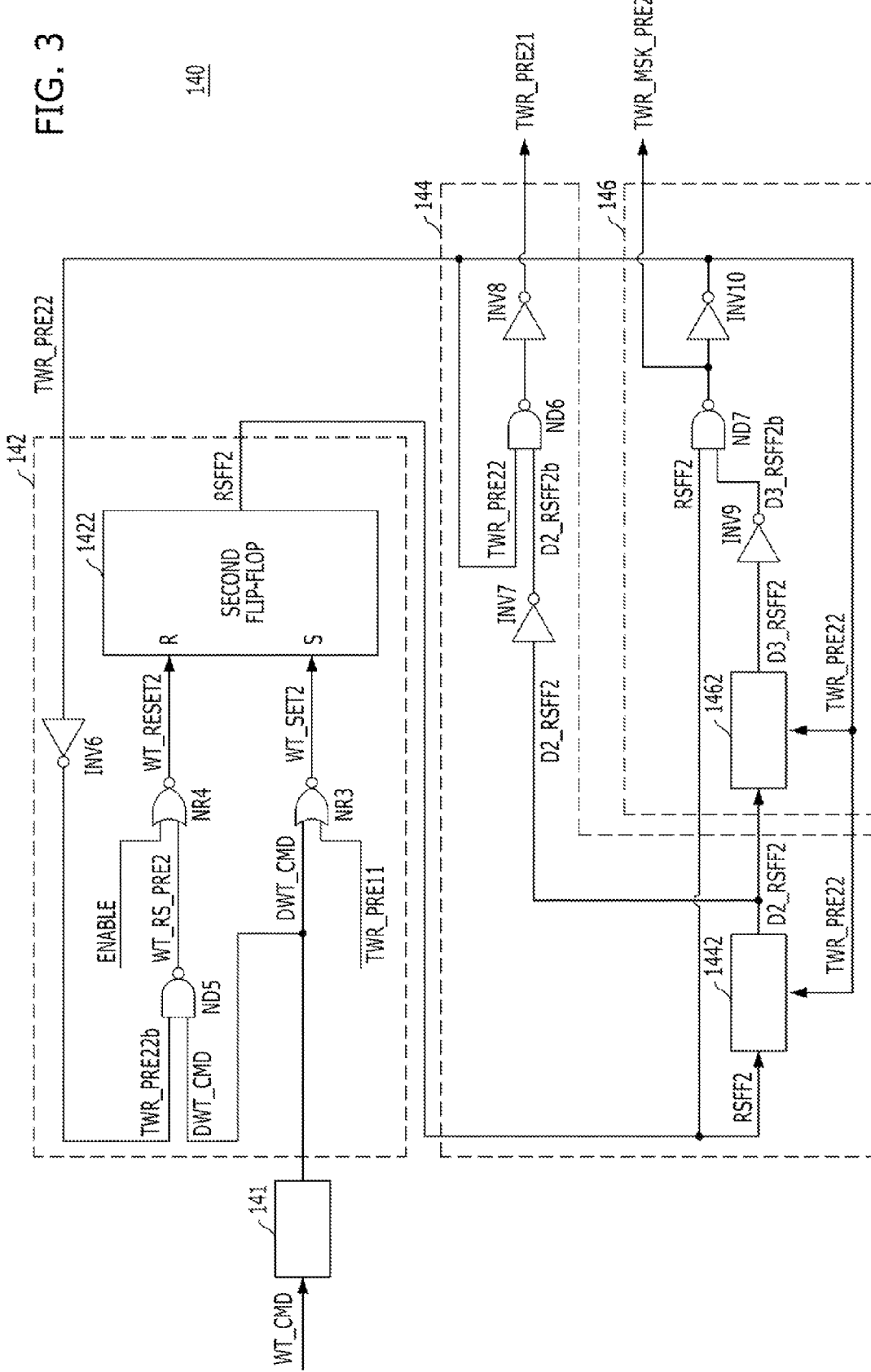
FIG. 3 is a circuit diagram illustrating a second pulse generation unit shown in FIG. 1 in accordance with an embodiment of the present invention.

FIG. 3 is a circuit diagram illustrating a second pulse generation unit shown in FIG. 1 in accordance with an embodiment of the present invention.

As shown in FIG. 3, the second pulse generation unit 140 includes a command delay unit 141, a second pulse activation control unit 142, a second input preparation signal activation control unit 144 and a second operation initial signal activation control unit 146.

The command delay unit 141 receives and delays the plurality of write commands WT_CMD by a fourth delay amount DELAY4, which is shorter than the second delay amount DELAY2, and outputs a plurality of delayed write commands DWT_CMD.

The second pulse activation control unit 142 activates a second pulse TWR_MSK_PRE2 in response to a first delayed write command out of the plurality of delayed write commands DWT_CMD when the second pulse TWR_MSK_PRE2 is inactivated during an activation period of a second input preparation signal TWR_PRE11 and inactivates the second pulse TWR_MSK_PRE2 in response to an activation of a second operation initial signal TWR_PRE22.

The second pulse activation control unit 142 includes a sixth inverter INV6, a third NOR gate NR3, a fifth NAND gate ND5, a fourth NOR gate NR4, and a second flip-flop 1422.

The sixth inverter INV6 inverts the second operation initial signal TWR_PRE22 and outputs an inverted second operation initial signal TWR_PRE22b. The third NOR gate NR3 receives the plurality of delayed write commands DWT_CMD and the second input preparation signal TWR_PRE11, performs a NAND logic operation, and outputs a plurality of second flip-flop set signals WT_SET3 as a result value of the NAND logic operation. The fifth NAND gate ND5 receives the plurality of delayed write commands DWT_CMD and the inverted second operation initial signal TW_PRE22b and outputs a plurality of second reset preparation signals WT_RS_PRE2. The fourth NOR gate NR4 receives an enable signal ENABLE and the plurality of second reset preparation signals WT_RS_PRE2, performs a NOR logic operation, and outputs a plurality of second flip-flop reset signals WT_RESET2. The second flip-flip 1422 activates a second pre-pulse RSFF2 in response to the plurality of second flip-flop set signals WT_SET2, and inactivates the second pre-pulse RSFF2 in response to the plurality of second flip-flop reset signals WT_RESET2.

The second input preparation signal activation control unit 144 activates the first input preparation signal TWR_PRE21 at a delayed time from the activation time of the second pulse TWR_MSK_PRE2 by a second delay amount DELAY2 and inactivates the first input preparation signal TWR_PRE21 in response to inactivation of the second operation initial signal TWR_PRE22.

The second input preparation signal activation control unit 144 includes a third delay unit 1442, a seventh inverter INV7, a sixth NAND gate ND3, and an eighth inverter INV8.

The third delay unit 1442 receives and delays the second pre-pulse RSFF2 by the second delay amount DELAY2 and outputs a second D2_delay pre-pulse D2_RSFF2. The seventh inverter INV7 inverts the second D2_delay pre-pulse D2_RSFF2 and outputs an inverted second D2_delay pre-pulse D2_RSFF2b. The sixth NAND gate ND6 receives the inverted second D2_delay pre-pulse D2_RSFF2b and the second operation initial signal TWR_PRE22 and performs a NAND logic operation. The eighth inverter INV8 inverts a result value of the NAND logic operation and outputs the first input preparation signal TWR_PRE21 as an inverted result value.

The second operation initial signal activation control unit 146 activates the second operation initial signal TWR_PRE22 at a delayed time from the activation time of the first input preparation signal TWR_PRE21 by the third delay amount DELAY3 and inactivates the second operation initial signal TWR_PRE22 in response to the activation of the second pulse TWR_MSK_PRE2. The first delay amount DELAY1 is substantially same as a sum of the second delay amount DELAY2 and the third delay amount DELAY3.

The second operation initial signal activation control unit 146 includes a fourth delay unit 1462, a ninth inverter INV9, a seventh NAND gate ND7, and a tenth inverter INV10.

The fourth delay unit 1462 receives and delays the second D2_delay pre-pulse D2_RSFF2 by the third delay amount DELAY3, and outputs a second D3_delay pre-pulse D3_RSFF2. The ninth inverter INV9 inverts the second D3_delay pre-pulse D3_RSFF2 and outputs an inverted second D3_delay pre-pulse D3_RSFF2b. The seventh NAND gate ND7 receives the inverted second D3_delay pre-pulse D3_RSFF2b and the second pre-pulse RSFF2, performs a NAND logic operation, and outputs the second pulse TWR_MSK_PRE2. The tenth inverter INV10 inverts the second pulse TWR_MSK_PRE2 and outputs the second operation initial signal TWR_PRE22 as the inverted second pulse TWR_MSK_PRE2.

Figure 4:
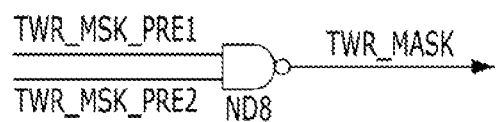
FIG. 4 is a circuit diagram illustrating a detailed configuration of an exemplary command mask signal generation unit included in a transfer control unit shown in FIG. 1 in accordance with an embodiment of the present invention.

FIG. 4 is a circuit diagram illustrating a first detailed configuration of an exemplary command mask signal generation unit 162 included in a transfer control unit 160 shown in FIG. 1 in accordance with an embodiment of the present invention.

As shown in FIG. 4, the command mask signal generation unit 162 of the transfer control unit 160 shown in FIG. 1 in accordance with an embodiment of the present invention generates a command mask signal TWR_MASK having an activation period corresponding to a sum of the activation period of the first pulse TWR_MSK_PRE1 and the activation period of the second pulse TWR_MSK_PRE2.

The command mask signal generation unit 162 includes an eighth NAND gate ND8. The eighth NAND gate ND8 receives the first pulse TWR_MSK_PRE1 and the second pulse TWR_PRE2, performs a NAND logic operation, and outputs a command mask signal TWR_MASK.

Figure 5:
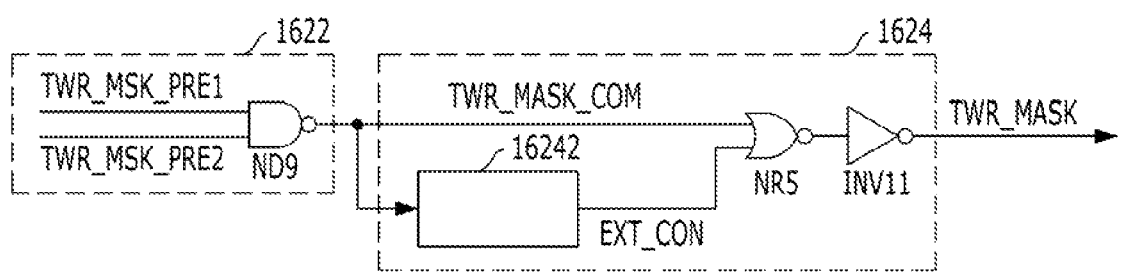
FIG. 5 is a circuit diagram illustrating another detailed configuration of an exemplary command mask signal generation unit included in a transfer control unit shown in FIG. 1 in accordance with an embodiment of the present invention.

FIG. 5 is a circuit diagram illustrating another detailed configuration of an exemplary command mask signal generation unit 162 included in a transfer control unit 160 shown in FIG. 1 in accordance with an embodiment of the present invention.

As shown in FIG. 5, the command mask signal generation unit 162 of the transfer control unit 160 shown in FIG. 1 in accordance with an embodiment of the present invention includes a pre-command mask signal generation unit 1622 and an activation period expansion unit 1624.

The pre-command mask signal generation unit 1622 generates a pre-command mask signal TWR_MASK_COM having an activation period corresponding to a sum of the activation period of the first pulse TWR_MSK_PRE1 and the activation period of the second pulse TWR_MSK_PRE2. The pre-command mask signal generation unit 1622 includes a ninth NAND gate ND9. The ninth NAND gate ND9 receives the first pulse TWR_MSK_PRE1 and the second pulse TWR_PRE2, performs a NAND logic operation, and outputs a pre-command mask signal TWR_MASK_COM.

The activation period expansion unit 1624 expands the activation period of the pre-command mask signal TWR_MASK_COM by a fifth delay amount DELAY5, and outputs a command mask signal TWR_MASK as an expanded pre-command mask signal.

The activation period expansion unit 1624 includes a fifth delay unit 16242, a fifth NOR gate NR5 and an eleventh inverter INV11.

The fifth delay unit 16242 delays the pre-command mask signal TWR_MASK_COM by the fifth delay amount DELAY5 and outputs an expansion control signal EXT_CON as a delayed pre-command mask signal TWR_MASK_COM. The fifth NOR gate NR5 receives the pre-command mask signal TWR_MASK_COM and the expansion control signal EXT_CON and performs a NOR logic operation. The eleventh inverter INV11 inverts a result value of the NOR logic operation of the fifth NOR gate NR5 and outputs the command mask signal TWR_MASK.

Here, in case that the fifth delay unit 16242 included in the command mask signal generation unit 162 is used, the second delay amount DELAY2 of the first delay unit 1242 and the third delay unit 1442 and the third delay amount DELAY3 of the second delay unit 1262 and the fourth delay unit 1462 may be designed to be reduced.

Figure 6:
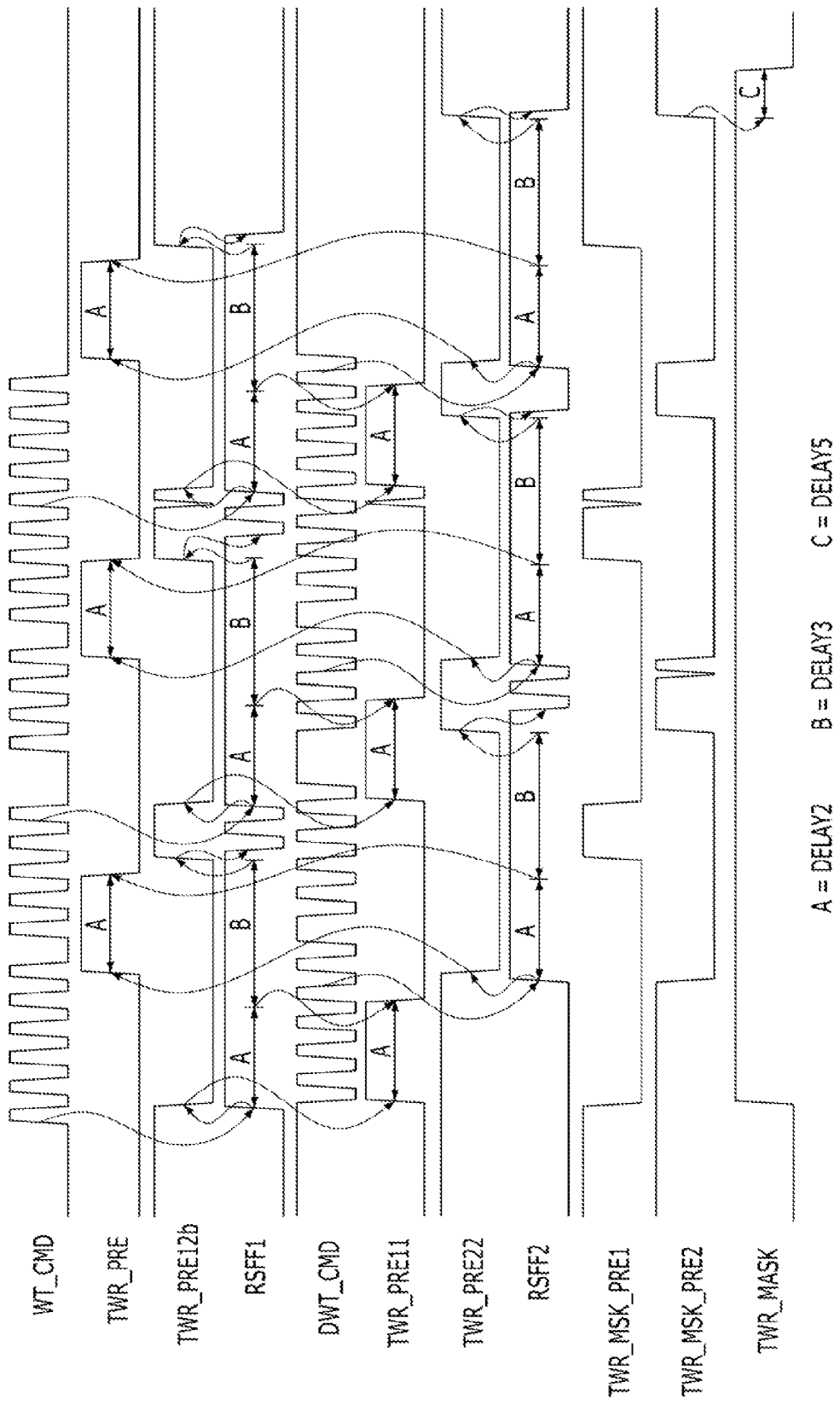
FIG. 6 is a timing diagram illustrating an operation of a semiconductor device shown in FIG. 1 in accordance with an embodiment of the present invention.

FIG. 6 is a timing diagram illustrating an operation of a semiconductor device shown in FIG. 1 in accordance with an embodiment of the present invention.

As referring to FIG. 6, a semiconductor device shown in FIG. 1 in accordance with an embodiment of the present invention starts to operate when the plurality of write commands WT_CMD are sequentially input.

Since the first input preparation signal TWR_PRE21 is of active-low state at an initial phase before the plurality of write commands WT_CMD are input, the first pre-pulse RSFF1 is activated to a logic high in response to a first write command out of the plurality of write commands WT_CMD. The first operation initial signal TWR_PRE12 is inactivated to the logic high in response to the activation of the first pre-pulse RSFF1 at the logic high. The first pulse TWR_MSK_PRE1 is activated to the logic low, and the command mask signal TWR_MASK is activated to the logic high.

Here, although the second input preparation signal TWR_PRE11 is of active-low state at the initial phase before the plurality of write commands WT_CMD are input, an activation of the second pulse TWR_MSK_PRE2 depends on the plurality of delayed write commands DWT_CMD, and thus the second pulse TWR_MSK_PRE2 is not activated when the first pulse TWR_MSK_PRE1 is activated.

Moreover, since the second input preparation signal TWR_PRE11 is inactivated to the logic high in response to the inactivation of the first operation initial signal TWR_PRE12, the second pulse TWR_MSK_PRE2 maintains an inactivation state at the logic high when the plurality of delayed write commands DWT_CMD are input.

Then, the second input preparation signal TWR_PRE11 is activated to the logic low at a delayed time from the activation of the first pre-pulse RSFF1 by the second delay amount DELAY2. The second pre-pulse RSFF2 is activated to the logic high in response to the first delayed write command out of the plurality of delayed write commands DWT_CMD after the second input preparation signal TWR_PRE11 is activated. Thus, the second operation initial signal TWR_PRE22 is inactivated to the logic high in response to the activation of the second pre-pulse RSFF2. At the same time, the second pulse TWR_MSK_PRE2 is activated to the logic low, and the command mask signal TWR_MASK maintains a state of the logic high at the activation time of the second pulse TWR_MSK_PRE2 since the command mask signal TWR_MASK is activated at the logic high in response to the activation of the first pulse TWR_MSK_PRE1 before the second pulse TWR_MSK_PRE2 is activated.

The first input preparation signal TWR_PRE21 is inactivated to the logic high in response to the inactivation of the second operation initial signal TWR_PRE22, and the first pulse TWR_MSK_PRE1 keeps active state (hereinafter referred to as active) since the first operation initial signal TWR_PRE12 keeps inactive state (hereinafter referred to as inactive) to the logic high.

The first input preparation signal TWR_PRE21 is activated to the logic low at a delayed time from the activation of the second pre-pulse RSFF2 by the second delay amount DELAY2. But, the first pulse TWR_MSK_PRE1 keeps active since the first operation initial signal TWR_PRE12 keeps active to the logic high.

Then, the first operation initial signal TWR_PRE12 is activated to the logic low at a delayed time from the activation time of the first pre-pulse RSFF1 by a sum of the second delay amount DELAY2 and the third delay amount DELAY3. The first pre-pulse RSFF1 is inactivated to the logic low in response to the activation of the first operation initial signal TWR_PRE12. Here, the third delay amount DELAY3 may be longer than the second delay amount DELAY2. At the same time, the first pulse TWR_MSK_PRE1 is inactivated to the logic high, but the command mask signal TWR_MASK maintains the logic high state since the second pulse TWR_MSK_PRE2 keeps active at the inactivation time of the first pulse TWR_MSK_PRE1.

After the first input preparation signal TWR_PRE21 is activated and the first pulse TWR_MSK_PRE1 is inactivated, since the plurality of write commands WT_CMD are sequentially input, the first pre-pulse RSFF1 is activated to the logic high. Although the first pre-pulse RSFF1 is instantaneously activated to the logic high in response to the write command WT_CMD after the activation of first input preparation signal TWR_PRE21 and the inactivation of the first pulse TWR_MSK_PRE1, the first pulse TWR_MSK_PRE1 keeps inactive to the logic high since the first pulse generation unit 120 needs a minimum initial time (larger than 0) for being initialized in response to the activation of the first operation initial signal TWR_PRE12 to the logic low.

That is, the write command WT_CMD, which is input before the minimum initial time of the first pulse generation unit 120, is not used in the activation of the first pulse TWR_MSK_PRE1, and the first pulse TWR_MSK_PRE1 is activated again in response to the write command WT_CMD, which is input after the first pulse generation unit 120 is completely initialized.

The second input preparation signal TWR_PRE11 is inactivated to the logic high in response to another activation of the first pre-pulse RSFF1 to the logic high. Then, the second input preparation signal TWR_PRE11 keeps inactive during the second delay amount DELAY2.

After the second pre-pulse signal RSFF2 is activated, and the second delay amount DELAY2 and the third delay amount DELAY3 elapse, the second pre-pulse signal RSFF2 is inactivated. Since the inactivation time of the second operation initial signal TWR_PRE22 to the logic low is prior to the activation time of the second input preparation signal TWR_PRE11 to the logic low, the second pre-pulse signal RSFF2 is activated again in response to the plurality of delayed write commands DWT_CMD after the second input preparation signal TWR_PRE11 is activated.

Since the first pulse TWR_MSK_PRE1 keeps inactive at the inactivation time of the second pre-pulse RSFF2 after the second pre-pulse RSFF2 is activated and the sum period of the second delay amount DELAY2 and the third delay amount DELAY3 elapses, the command mask signal TWR_MASK maintains the logic high.

As described above, since the first pulse TWR_MSK_PRE1 and the second pulse TWR_MSK_PRE2 are alternatively activated without overlapping in response to the plurality of write commands WT_CMD that are sequentially input, the inactivation period of the first pulse TWR_MSK_PRE1 and the second pulse TWR_MSK_PRE2 does not exist at the same time. Accordingly, after the command mask signal TWR_MASK is activated at the logic high, the command mask signal TWR_MASK keeps activated during sequential input of the plurality of write commands WT_CMD.

That is, the first pulse TWR_MSK_PRE1 keeps active irrespective of the succeeding write commands WT_CMD that are input during the sum of the second delay amount DELAY2 and the third delay amount DELAY3 when the first input preparation signal TWR_PRE21 is activated, the first operation initial signal TWR_PRE12 is activated, the first pulse TWR_MSK_PRE1 is inactivated, and the first pulse TWR_MSK_PRE1 is activated in response to the write commands WT_CMD.

Similarly, the second pulse TWR_MSK_PRE2 keeps active irrespective of the delayed write commands DWT_CMD that are succeedingly input during the sum period of the second delay amount DELAY2 and the third delay amount DELAY3 when the second input preparation signal TWR_PRE11 is activated, the second operation initial signal TWR_PRE22 is activated, the second pulse TWR_MSK_PRE2 is inactivated, and the second pulse TWR_MSK_PRE2 is activated in response to the delayed write commands DWT_CMD.

Accordingly, after the write commands WT_CMD are not input anymore, the first pulse TWR_MSK_PRE1 or the second pulse TWR_MSK_PRE2 keeps active during a predetermined period. Thus, in spite that the sequential input of the plurality of the write commands WT_CMD stops, the command mask signal TWR_MASK keeps active during a predetermined period.

And, after all of the first pulse TWR_MSK_PRE1 and the second pulse TWR_MSK_PRE2 are inactivated, the command mask signal TWR_MASK keeps active further for the time of the fifth delay amount DELAY5.

This is an additional operation for securing the write recovery time in the worst case that the write commands WT_CMD are input during the inactivation period of both of the first pulse TWR_MSK_PRE1, and the second pulse TWR_MSK_PRE2.

That is, the write recovery time for the last write command may be shorter than the sum period of the second delay amount DELAY2 and the third delay amount DELAY3 in the worst case that the write commands WT_CMD are input during the inactivation period of both of the first pulse TWR_MSK_PRE1 and the second pulse TWR_MSK_PRE2. Accordingly, even if this case, the write recovery time may be secured.

As described in connection with FIG. 4, an embodiment of the present invention may be implemented without application of the fifth delay amount DELAY5 if the second delay amount DELAY2 and the third delay amount DELAY3 are set to have a sufficiently long period. Otherwise, another embodiment of the present invention may be implemented with application of the fifth delay amount DELAY5, as described in connection with FIG. 5. The second delay amount. DELAY2 and the third delay amount DELAY3 are preset.

As described above, the semiconductor device in accordance with embodiments of the present invention may prevent a write operation from abnormal termination by masking any other commands including a precharge command except write commands during a predetermined period when write commands are input with sequential manner. That is, the semiconductor device in accordance with embodiments of the present invention may prevent incorrect write operation by secure the write recovery time.

Hereinafter, the semiconductor device in accordance with another embodiment of the present invention will be described as below.

Figure 7:
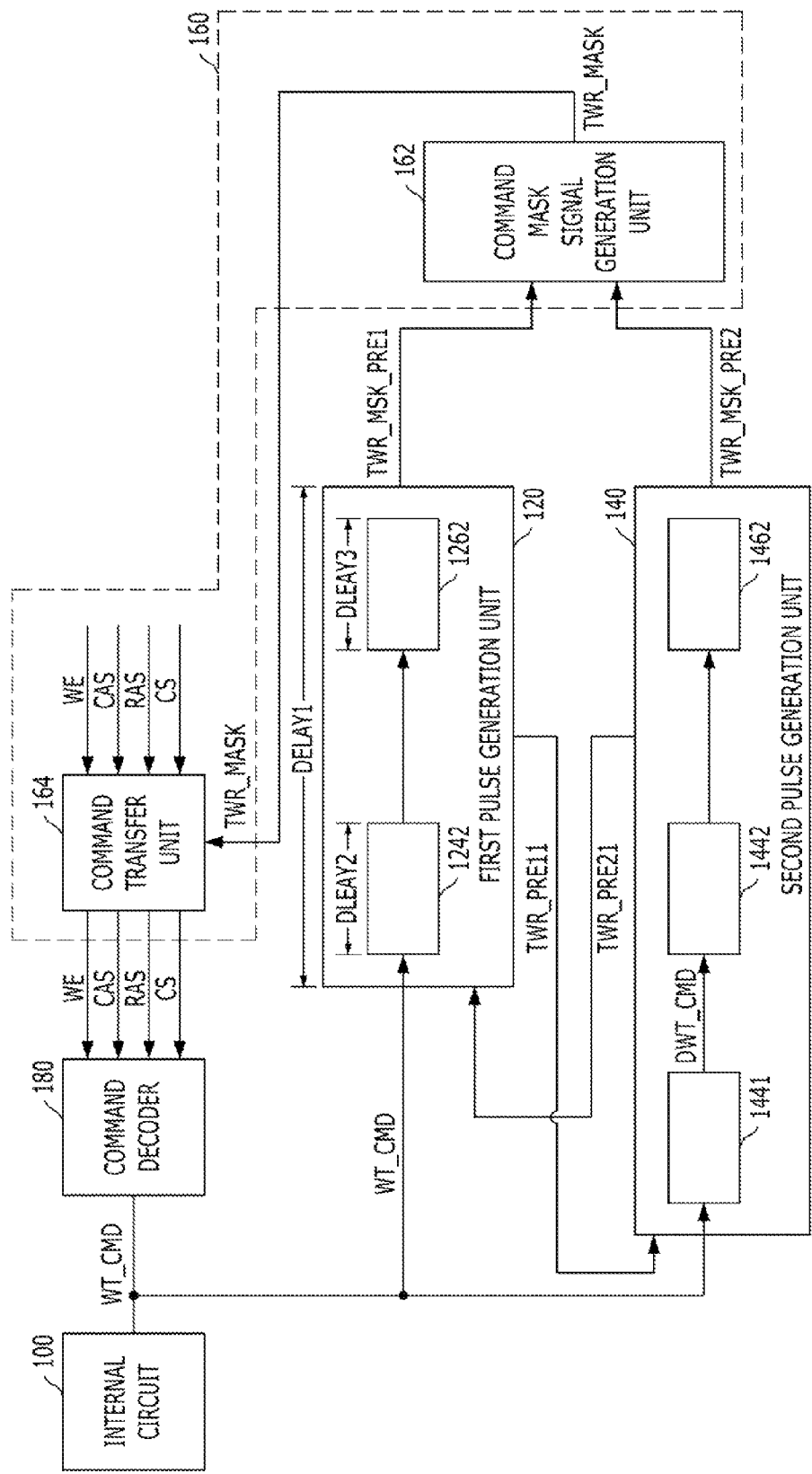
FIG. 7 is a circuit diagram illustrating a semiconductor device in accordance with another embodiment of the present invention.

FIG. 7 is a circuit diagram illustrating the semiconductor device in accordance with another embodiment of the present invention.

Referring to FIG. 7, a semiconductor device in accordance with another embodiment of the present invention includes an internal circuit 100, a first pulse generation unit 120, a second pulse generation unit 140, a transfer control unit 160, and a command decoder 180.

The internal circuit 100, the first pulse generation unit 120 and the second pulse generation unit 140 shown in FIG. 7 are substantially the same as the internal circuit 100, the first pulse generation unit 120 and the second pulse generation unit 140 shown in FIG. 1. Thus, the detailed description of the internal circuit 100, the first pulse generation unit 120 and the second pulse generation unit 140 will be omitted.

The transfer control unit 160 prevents the other commands except the plurality of write commands WT_CMD from being transferred to the internal circuit 100 during a sum of the activation period of the first pulse TWR_MSK_PRE1 and the activation period of the second pulse TWR_MSK_PRE2.

The command decoder 180 receives and decodes a write enable signal WE, a column address strobe signal CAS, a row address strobe signal RAS, and a chip selection signal CS and generates and transfers the plurality of write command WT_CMD and the other commands to the internal circuit 100.

Here, the transfer control unit 160 includes a command mask signal generation unit 162 and a command transfer unit 164.

The command mask signal generation unit 162 generates a command mask signal TWR_MASK having an activation period corresponding to a sum of the activation period of the first pulse TWR_MSK_PRE1 and the activation period of the second pulse TWR_MSK_PRE2.

The command transfer unit 164 receives and transfers selectively the write enable signal WE, the column address strobe signal CAS, the row address strobe signal RAS, and the chip selection signal CS in response to a command mask signal TWR_MASK.

That is, during the activation period of the command mask signal TWR_MASK, the command transfer unit 164 transfers the write enable signal WE, the column address strobe signal CAS, the row address strobe signal RAS, and the chip selection signal CS to the command decoder 180 when the write enable signal WE, the column address strobe signal CAS, the row address strobe signal RAS, and the chip selection signal CS have a value corresponding to the write commands WT_CMD. However, the command transfer unit 164 does not transfer the write enable signal WE, the column address strobe signal CAS, the row address strobe signal RAS, and the chip selection signal CS to the command decoder 180 when the write enable signal WE, the column address strobe signal CAS, the row address strobe signal RAS, and the chip selection signal CS have a different value from the value corresponding to the write commands WT_CMD. Thus, the command transfer unit 164 prevents the command decoder 180 from generating the other commands during the activation period of the mask signal TWR_MASK.

Moreover, during the inactivation period of the command mask signal TWR_MASK, the command transfer unit 164 bypasses the write enable signal WE, the column address strobe signal CAS, the row address strobe signal RAS, and the chip selection signal CS to the command decoder 180. Thus, the command transfer unit 164 does not have an influence on the operation of the semiconductor device.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
    an internal circuit configured to perform write operations in response to each of a plurality of write commands, wherein the plurality of write commands are sequentially input to the internal circuit;
    a first pulse generation unit configured to generate a first pulse activated during a first delay amount in response to a write command, which is input during an inactivation period of the first pulse, out of the plurality of write commands;
    a second pulse generation unit configured to generate a second pulse activated during the first delay amount in response to a delayed write command, which is input during an inactivation period of the second pulse, out of the plurality of write commands after a second delay amount from the activation time of the first pulse; and
    a transfer control unit configured to prevent commands other than the plurality of write commands from being transferred to the internal circuit during a sum of the activation period of the first pulse and the activation period of the second pulse.

2. The semiconductor device of claim wherein the transfer control unit comprises:
    a command mask signal generation unit configured to generate a command mask signal having an activation period corresponding to the sum of the activation period of the first pulse and the activation period of the second pulse; and
    a command transfer unit configured to prevent the commands other than the plurality of write commands from being transferred to the internal circuit during the activation period of the command mask signal.

3. The semiconductor device of claim 2, wherein a sum of the first delay amount and the second delay amount is a write recovery time of the semiconductor device.

4. The semiconductor device of claim 3, wherein each of the first delay amount and the second delay amount is synchronized with an operation clock of the semiconductor device and has a predetermined period according to the operation clock of the semiconductor device.

5. The semiconductor device of claim 3, wherein each of the first delay amount and the second delay amount has a predetermined period.

6. The semiconductor device of claim 1, wherein the transfer control unit prevent the commands other than the plurality of write commands from being transferred to the internal circuit during a predetermined expansion period further to the sum of the activation period of the first pulse and the activation period of the second pulse.

7. The semiconductor device of claim 6, wherein the transfer control unit comprises:
    a pre-command mask signal generation unit configured to generate a pre-command mask signal having an activation period corresponding to the sum of the activation period of the first pulse and the activation period of the second pulse;
    an activation period expansion unit configured to expand the activation period of the pre-command mask signal by the predetermined expansion period, and to output a command mask signal as an expanded pre-command mask signal; and
    a command transfer unit configured to prevent the commands other than the plurality of write commands from being transferred to the internal circuit during the activation period of the command mask signal.

8. The semiconductor device of claim 7, wherein a sum of the first delay amount and the second delay amount and the predetermined expansion period is a write recovery time of the semiconductor device.

9. The semiconductor device of claim 8, wherein each of the first delay amount, the second delay amount, and the predetermined expansion period is synchronized with an operation clock of the semiconductor device and has a predetermined period according to the operation clock of the semiconductor device.

10. The semiconductor device of claim 8, wherein each of the first delay amount, the second delay amount and the predetermined expansion period has a predetermined period.

11. The semiconductor device of claim 1, wherein the first pulse generation unit comprises:
    a first pulse activation control unit configured to activate the first pulse in response to a first write command out of the plurality of write commands when the first pulse is inactivated during an activation period of a first input preparation signal, and to inactivate the first pulse in response to an activation of a first operation initial signal;
    a first input preparation signal activation control unit configured to activate a second input preparation signal at a delayed time from the activation time of the first pulse by the second delay amount, and to inactivate the second input preparation signal in response to inactivation of the first operation initial signal; and
    a first operation initial signal activation control unit configured to activate the first operation initial signal at a delayed time from the activation time of the second input preparation signal by a third delay amount, and to inactivate the first operation initial signal in response to the activation of the first pulse, wherein the first delay amount is same as a sum of the second delay amount and the third delay amount.

12. The semiconductor device of claim 11, wherein the second pulse generation unit comprises:

a command delay unit configured to delay the plurality of write commands by a fourth delay amount, which is shorter than the second delay amount, and to output a plurality of delayed write commands;

a second pulse activation control unit configured to activate the second pulse in response to a first write command out of the plurality of delayed write commands when the second pulse is inactivated during an activation period of the second input preparation signal, and to inactivate the second pulse in response to an activation of the second operation initial signal;

a second input preparation signal activation control unit configured to activate the first input preparation signal at a delayed time from the activation time of the second pulse by the second delay amount, and to inactivate the first input preparation signal in response to inactivation of the second operation initial signal; and a second operation initial signal activation control unit configured to activate the second operation initial signal at a delayed time from the activation time of the first input preparation signal by the third delay amount, and to inactivate the second operation initial signal in response to the activation of the second pulse.

13. The semiconductor device of claim 1, wherein the transfer control unit is configured to prevent a precharge command from being transferred to the internal circuit during a sum of the activation period of the first pulse and the activation period of the second pulse.

14. An operation method of a semiconductor device, comprising:

activating a first pulse and inactivating a second input preparation signal in response to a plurality of write commands when a first input preparation is activated and the first pulse is inactivated, wherein the plurality of write commands are sequentially input to an internal circuit;

activating the second input preparation signal at a delayed time from the activation of the first pulse by a first delay amount, and inactivating the first pulse at a second delay amount;

activating a second pulse and inactivating the first input preparation signal in response to the plurality of write commands when the second input preparation signal is activated and the second pulse is inactivated;

activating the first input preparation signal at a delayed time from the activation of the second pulse by the first delay amount and inactivating the second pulse at a delayed time by the second delay amount after the first delay amount; and preventing commands other than the plurality of write commands from being transferred to the internal circuit during an overlapped period of the activation of the first pulse and the activation of the second pulse.

15. The operation method of claim 14, wherein the activating of the first pulse comprises:

activating the first pulse in response to a first write command out of the plurality of write commands when the first input preparation signal is activated and the first pulse is inactivated;

inactivating a first operation initial signal in response to the activation of the first pulse; and inactivating the second input preparation signal in response to the inactivation of the first operation initial signal.

16. The operation method of claim 15, wherein the activating of the second input preparation signal and the inactivating of the first pulse comprise:

activating the second input preparation signal at the delayed time from the activation of the first pulse by the first delay amount;

activating the first operation initial signal at a delayed time from the activation of the first pulse by a sum of the first delay amount and the second delay amount; and inactivating the first pulse in response to the activation of the first operation initial signal.

17. The operation method of claim 16, wherein the activating of the second pulse and the inactivating of the first input preparation signal comprise:

activating the second pulse in response to the first write command when the second input preparation signal is activated and the second pulse is inactivated;

inactivating a second operation initial signal in response to the activation of the second pulse; and inactivating the first input preparation signal in response to the inactivation of the second operation initial signal.

18. The operation method of claim 17, wherein the activating of the first input preparation signal and the inactivating of the second pulse comprise:

activating the first input preparation signal at a delayed time from the activation of the second pulse by the first delay amount;

activating the second operation initial signal at a delayed time from the activation of the second pulse by the sum of the first delay amount and the second delay amount; and inactivating the second pulse in response to the activation of the second operation initial signal.

19. The operation method of claim 14, wherein the preventing of the commands comprise:

generating a command mask signal having an activation period corresponding to a sum of the activation period of the first pulse and the activation period of the second pulse; and preventing the commands other than the plurality of rite commands from being transferred to the internal circuit during the activation of the command mask signal.

20. The operation method of claim 14, wherein the preventing of the commands prevents the commands other than the plurality of write commands from being transferred to the internal circuit during an expansion period further to the overlapped period of the activation of the first pulse and the activation of the second pulse.

21. The operation method of claim 20, wherein the preventing of the commands comprise:

generating a pre-command mask signal having an activation period corresponding to a sum of the activation period of the first pulse and the activation period of the second pulse;

outputting a command mask signal by expanding the activation of the pre-command mask signal by the expansion period; and preventing the commands other than the plurality of write commands from being transferred to the internal circuit during the activation period of the command mask signal.

* * * * *